United States Patent
Patil et al.

(10) Patent No.: US 9,300,315 B2
(45) Date of Patent: Mar. 29, 2016

(54) SYSTEMS AND METHODS FOR IMPLEMENTING ERROR-SHAPING ALIAS-FREE ASYNCHRONOUS FLIPPING ANALOG TO DIGITAL CONVERSION

(71) Applicants: THE TRUSTEES OF COLUMBIA UNIVERSITY IN THE CITY OF NEW YORK, New York, NY (US); COMMISSARIAT A L'ENERGIE ATOMIQUE, Paris (FR)

(72) Inventors: Sharvil Pradeep Patil, New York, NY (US); Yannis Tsividis, New York, NY (US); Dominique Morche, Meylan (FR); Alin Ratiu, Grenoble (FR)

(73) Assignees: The Trustees of Columbia University in the City of New York, New York, NY (US); COMMISSARIAT A L'ENERGIE ATOMIQUE, Paris (FR)

( * ) Notice: Subject to any disclaimer, the term of this patent is extended or adjusted under 35 U.S.C. 154(b) by 0 days.

(21) Appl. No.: 14/738,044

(22) Filed: Jun. 12, 2015

(65) Prior Publication Data
US 2015/0365098 A1    Dec. 17, 2015

Related U.S. Application Data

(60) Provisional application No. 62/012,843, filed on Jun. 16, 2014.

(51) Int. Cl.
*H03M 1/12* (2006.01)
*H03K 5/24* (2006.01)
*H03K 5/1534* (2006.01)

(52) U.S. Cl.
CPC .............. *H03M 1/12* (2013.01); *H03K 5/1534* (2013.01); *H03K 5/24* (2013.01)

(58) Field of Classification Search
CPC .......... H03M 1/12; H03K 5/1534; H03K 5/24
USPC .................................................. 341/143, 155
See application file for complete search history.

(56) References Cited

U.S. PATENT DOCUMENTS

| | | | | |
|---|---|---|---|---|
| 7,956,778 B2 * | 6/2011 | Koyama | ................ | H03M 1/201 341/131 |
| 8,044,837 B2 * | 10/2011 | Mboli | ................... | H03M 1/125 341/118 |
| 8,139,654 B2 * | 3/2012 | Chen | ........................ | H03K 7/06 375/259 |
| 2012/0169397 A1 * | 7/2012 | Eliezer | ................... | G06G 7/186 327/336 |

OTHER PUBLICATIONS

Kurchuk, M. et al., "GHz-Range Continuous-Time Programmable Digital FIR with Power Dissipation that Automatically Adapts to Signal Activity," ISSCC 2011/Session 12/Design in Emerging Technologies/12.9, 2011 IEEE International Solid-State Circuits Conference, pp. 232-233, 3 pages (2011).

(Continued)

*Primary Examiner* — Khai M Nguyen
(74) *Attorney, Agent, or Firm* — Wilmer Cutler Pickering Hale and Dorr LLP

(57) ABSTRACT

A programmable, quantization error spectral shaping, alias-free asynchronous analog-to-digital converter (ADC) is provided. The ADC can be used for clock-less, continuous-time digital signal processing in receivers with modest Signal to Noise-plus-Distortion Ratio (SNDR) requirements and a tight power budget.

20 Claims, 13 Drawing Sheets

Fig. 2a

(56) References Cited

OTHER PUBLICATIONS

Pletcher, N. M. et al., "A 2GHz 52μW Wake-Up Receiver with -72dBm Sensitivity Using Uncertain-IF Architecture," ISSCC 2008/ Session 29/TD: Trends in Communication Circuits & Systems/29.2, 2008 IEEE International Solid-State Circuits Conference, pp. 524-525 and p. 633 (2008).

Schell, B. and Tsividis, Y., "A Clockless ADC/DSP/DAC System with Activity-Dependent Power Dissipation and No Aliasing," ISSCC 2008/Session 30/ Data-Converter Techniques/30.6, 2008 IEEE International Solid-State Circuits Conference, pp. 550-551 and p. 635 (2008).

Straayer, M. Z. and Perrott, M. H., "A 12-Bit, 10-MHz Bandwidth, Continuous-Time ΣΔ ADC With a 5-Bit, 950-MS/s VCO-Based Quantizer," IEEE Journal of Solid-State Circuits, vol. 43, No. 4, pp. 805-814 (Apr. 2008).

Vandeursen, J. M. and Peperstraete, J. A., "Analog-to-Digital Conversion Based on a Voltage-to-Frequency Converter," IEEE Transactions on Industrial Electronics and Control Instrumentation, vol. IECI-26, No. 3, pp. 161-166 (Aug. 1979).

Weltin-Wu, C. and Tsividis, Y., "An Event-Driven, Alias-Free ADC with Signal-Dependent Resolution," 2012 Symposium on VLSI Circuits Digest of Technical Papers, pp. 28-29 (2012).

* cited by examiner

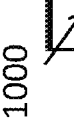

| | [Yoshioka, et al., VLSI2013] | [Tsai, et al., VLSI2011] | [Van der Plas, et al., ISSCC2008] | [Brooks, et al., ISSCC2007] | Asynchronous flipping ADC |
|---|---|---|---|---|---|
| Technology | 40nm CMOS | 90nm CMOS | 90nm CMOS | 180nm CMOS | ST 28nm UTBB FDSOI CMOS |
| Supply | 0.7V | 1V | 1V | 1.8V | 0.65V |
| Input bandwidth | 12.3MHz | 20MHz | 75MHz | 100MHz | 40MHz (10MHz-50MHz) |
| Sampling rate | 24.6MS/s | 40MS/s | 150MS/s | 200MS/s | Signal-dependent |
| Core area | 0.0058mm$^2$ | 0.055mm$^2$ | 0.0625mm$^2$ | 0.05mm$^2$ | 0.0032mm$^2$ |
| SNDR | 44.2dB | 44.5dB | 40dB | 40.3dB | 32dB-42dB |
| Total power | 54.6μW* | 113μW* | 133μW* | 8500μW* | 24μW (8μW standby) |
| FoM | 17fJ/conv-step | 20fJ/conv-step | 10.9fJ/conv-step | 503.3fJ/conv-step | 3-10fJ/conv-step + |
| Antialiasing filter required? | Yes | Yes | Yes | Yes | No |

+ FoM calculated using $P/(2^{ENOB} \times 2 \times f_{BW})$, where $f_{BW}$ is 40MHz.
*Does not include power dissipation of the antialiasing filter.

Fig. 10

SYSTEMS AND METHODS FOR IMPLEMENTING ERROR-SHAPING ALIAS-FREE ASYNCHRONOUS FLIPPING ANALOG TO DIGITAL CONVERSION

CROSS-REFERENCE TO RELATED APPLICATIONS

This application claims the benefit under 35 U.S.C. §119 (e) of U.S. Provisional Patent Application No. 62/012,843, entitled "AN ASYNCHRONOUS FLIPPING SIGMA-DELTA-LIKE MODULATOR," filed on Jun. 16, 2014, the contents of which are incorporated by reference herein in their entirety.

STATEMENT REGARDING FEDERALLY SPONSORED RESEARCH OR DEVELOPMENT

This invention was made with government support under NSF Grant No. CCF-0964606 awarded by the National Science Foundation. The government has certain rights in the invention.

FIELD OF THE DISCLOSURE

This disclosure relates to systems and methods for performing analog-to-digital conversion, and particularly systems and methods for performing error-shaping alias-free asynchronous analog-to-digital conversion.

BACKGROUND

Ultra-low-power radio receivers have very tight power budgets, for example, 100 μW in wake-up receivers. The tight power budget in those receivers limits multichannel capabilities and blocker robustness. Digitization and digital signal processing (DSP) present an interesting solution, and can further enable interferer-resilient spread spectrum techniques. However, digitization and DSP demand an analog-to-digital converter (ADC) to digitize analog samples, for example, in the 10 MHz-50 MHz intermediate frequency (IF) bandwidth (BW) (bounded by the 1/f corner and the LO drift), while consuming only a few tens of μW with a modest Signal to Noise-plus-Distortion Ratio (SNDR). A Nyquist ADC cannot satisfy such a power constraint, because of its strict anti-aliasing filter specifications. Oversampling can simplify this requirement; however, a high sampling rate can result in a substantial power overhead, not just for the ADC, but also for subsequent processing blocks. Thus, there is a need for a power-efficient ADC with relaxed or no antialiasing constraints and a low output data rate.

SUMMARY

According to aspects of the disclosure, an apparatus for asynchronous analog-to-digital conversion is provided. The apparatus can include an integrator circuit comprising two integrator inputs and two integrator outputs and a first switch circuit configured to couple a first apparatus input signal and a second apparatus input signal with a first integrator input and a second integrator input. The apparatus can also include a first comparator configured to receive a first output of the integrator circuit and a first reference signal and generate a first comparator output signal, and a second comparator configured to receive a second output of the integrator circuit and the first reference signal and generate a second comparator output signal. The apparatus can also include a second switch circuit configured to couple a first apparatus output and a second apparatus output with the first comparator output signal and the second comparator output signal.

The apparatus can also include a third comparator configured to receive the first output of the integrator circuit and a second reference signal and generate a third comparator output signal, and a fourth comparator configured to receive the second output of the integrator circuit and the second reference signal, and generate a fourth comparator output signal.

According to alternative aspects of the disclosure, a method for asynchronous analog-to-digital conversion is provided. The method can include providing an integrator circuit comprising two integrator inputs and two integrator outputs, and coupling, by a first switch circuit, a first apparatus input signal and a second apparatus input signal with a first integrator input and a second integrator input. The method can also include receiving, by a first comparator, a first output of the integrator circuit and a first reference signal, generating, by the first comparator, a first comparator output signal, receiving, by a second comparator, a second output of the integrator circuit and the first reference signal, generating, by the second comparator, a second comparator output signal, and coupling, by a second switch circuit, a first apparatus output and a second apparatus output with the first comparator output signal and the second comparator output signal.

The method can also include receiving, by a third comparator, the first output of the integrator circuit and a second reference signal, generating, by the third comparator, a third comparator output signal, receiving, by a fourth comparator, the second output of the integrator circuit and the second reference signal, and generating, by the fourth comparator, a fourth comparator output signal.

DESCRIPTION OF DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 10 shows a table comparing different ADCs.

DETAILED DESCRIPTION

An approach for power-efficient ADCs can be an asynchronous ADC, which operates in continuous time (CT) and causes no aliasing, thus requiring no antialiasing filter. According to aspects of the disclosure, the timing between pulses in an asynchronous digital output is an integral part of the signal representation. Accordingly, such a signal is "CT," and can have a non-uniform signal-dependent rate that can be low enough to not overwhelm the power dissipation of the following blocks. The output need not be sampled in time and can be processed directly via an asynchronous CT digital approach, in which timing details, as they evolve in CT, are preserved. A clock-less CT DSP doing this has already been demonstrated to be power efficient. While these are attractive features from a system perspective, existing moderate-resolution asynchronous ADCs themselves exhibit poor power efficiency. They employ delta modulators, which are limited by loop delay and slope overload. Power and area can be spent to overcome these limitations, which can result in suboptimal designs.

Figure 1:
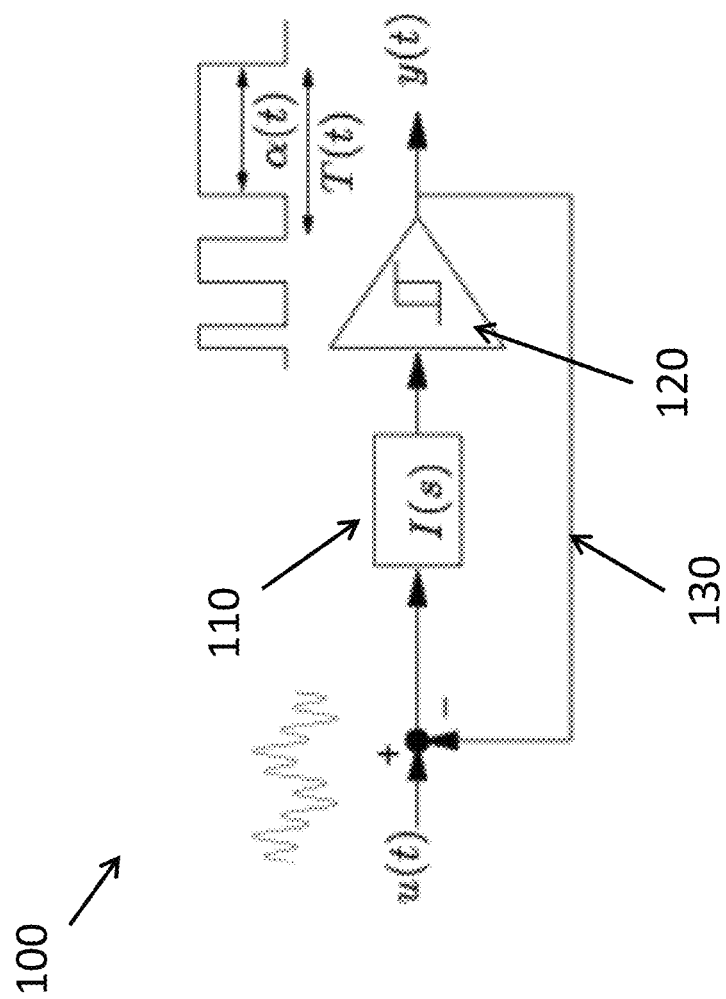
FIG. 1 shows the architecture of an exemplary asynchronous sigma-delta modulator.

FIG. 1 shows the architecture of an exemplary asynchronous sigma-delta modulator (ASDM) 100. A first-order ASDM can include an integrator 110 and a quantizer 120. The quantizer 120, shown in FIG. 1, can be a zero comparator with some hysteresis. ASDM 100 also has a feedback path 130, forming a feedback loop. ASDM 100 can encode the input signal, u(t), in the duty cycle of a binary signal, y(t). Even for a zero input, ASDM 100 can produce a 50%-duty-cycle oscillatory output. In power-constrained systems this can be an important disadvantage, as the modulator can waste energy even if there is no signal at its input.

According to aspects of the disclosure, a proposed asynchronous CT ADC can overcome these issues, for example, by simplifying the feedback path. The proposed ADC can be highly power-efficient and compact, alias-free with quantization-error spectral shaping, programmable and event-driven with low output data rate, and being clock-less, can have low electromagnetic interference (EMI) emissions.

To avoid the energy waste, the present disclosure provides a system and a method wherein a delta modulator encodes the integral of the input signal u(t). The proposed system is different from prior-art ASDMs, for example, because the output can be, in principle, a set of impulses that can indicate the time instants where the integral of the input signal crosses the quantization levels of a given quantizer. Unlike an ASDM, the output rate of impulses can be proportional to the instantaneous value of the input signal. Thus, for a zero input, no level is crossed after the integration stage, and hence, no output is produced. However, given the similarity in the forward paths in the two integrators, there can be shaping of quantization artifacts, such as noise or harmonics, in both implementations.

In some embodiments the proposed system is asynchronous, clock-less and does not sample the input in time. Therefore, no aliasing occurs and the output has no quantization noise. For a periodic input, this can result in an output that consists of only harmonics in its spectrum. Thus, without quantization noise, the quantization harmonics can get shaped following a transfer function defined by the filter in the forward path.

According to aspects of the disclosure, in a proposed asynchronous flipping ADC, the modulation/encoding can be implemented by replacing the N-bit feedback digital-to-analog converter (DAC) in a delta modulator with a single-bit DAC. Compared to prior art low power ASDM systems, the proposed system is particularly compact and can use minimal hardware for implementation. Accordingly, it can use smaller silicon area, and hence, be cost-efficient.

Figures 2A, 2B:
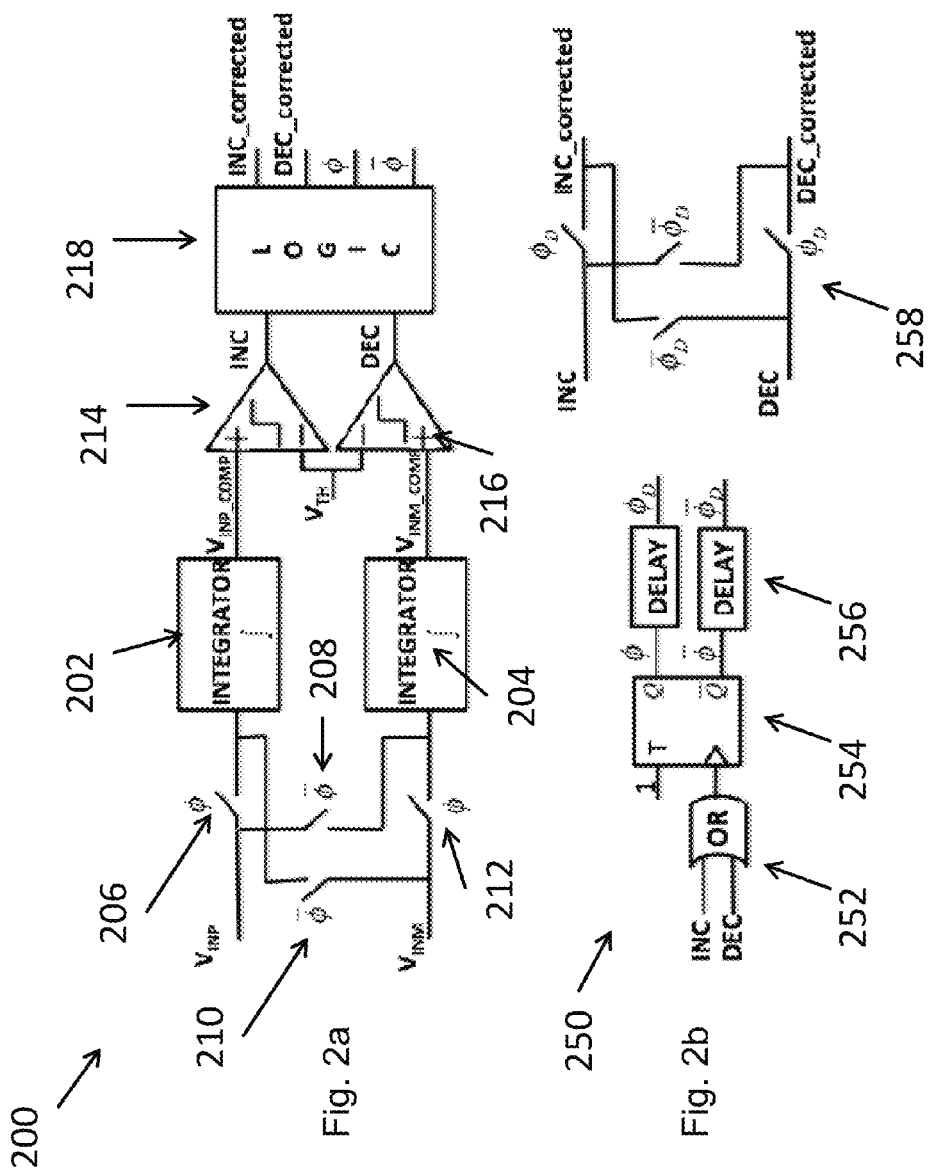
FIG. 2a shows an exemplary architecture of an asynchronous flipping ADC, according to aspects of the present disclosure.
FIG. 2b shows an exemplary implementation of a logic block in the asynchronous flipping ADC of FIG. 2a, according to aspects of the present disclosure.

FIG. 2a shows an exemplary architecture of a proposed asynchronous flipping ADC. According to aspects of the present disclosure, a system 200 for providing asynchronous flipping analog-to-digital conversion can comprise a first integrator 202 and a second integrator 204, a first switch 206 coupling the first integrator 202 with a first signal $V_{INP}$, a second switch 208 coupling the second integrator 204 with the first signal $V_{INP}$, a third switch 210 coupling the first integrator 202 with a second signal $V_{INM}$, and a fourth 212 switch coupling the second integrator 204 with the second signal $V_{INM}$. The system 200 can also comprise a first comparator 214 receiving a first threshold signal $V_{TH}$ and an output signal $V_{INP\_COMP}$ of the first integrator and generating an output signal INC, a second comparator 216 receiving the first threshold signal $V_{TH}$ and an output signal $V_{INM\_COMP}$ of the second integrator 204 and generating an output signal DEC.

The system 200 can also include a logic block 218 that can receive the output signals INC and DEC of the comparators 214 and 216, can generate the control signals for switches 206, 208, 210, and 212, and can generate signals "INC_corrected" and "DEC_corrected," which are the corrected output signals of the asynchronous flipping ADC.

FIG. 2b illustrates an exemplary implementation of the logic block 218. Logic block 218 can include an OR gate 252 configured to receive the INC and DEC output signals of comparators 214 and 216. A flip-flop, for example, a positive-edge-triggered T flip-flop 254 can receive the output of the OR gate 252 and can generate as outputs the control signals, $\phi$ and $\bar{\phi}$ that can control switches 206, 208, 210, and 212. Logic block 218 can also include delay elements 256 configured to delay the outputs, $\phi$ and $\bar{\phi}$, of flip-flop 254 to generate delayed versions $\phi_D$ and $\bar{\phi_D}$. Logic block 218 can also include switches 258 that can be controlled by $\phi_D$ and $\bar{\phi_D}$, to generate, from signals INC and DEC, the outputs of the "INC_corrected" and "DEC_corrected" of the asynchronous flipping ADC of FIG. 2(a).

Figure 3:
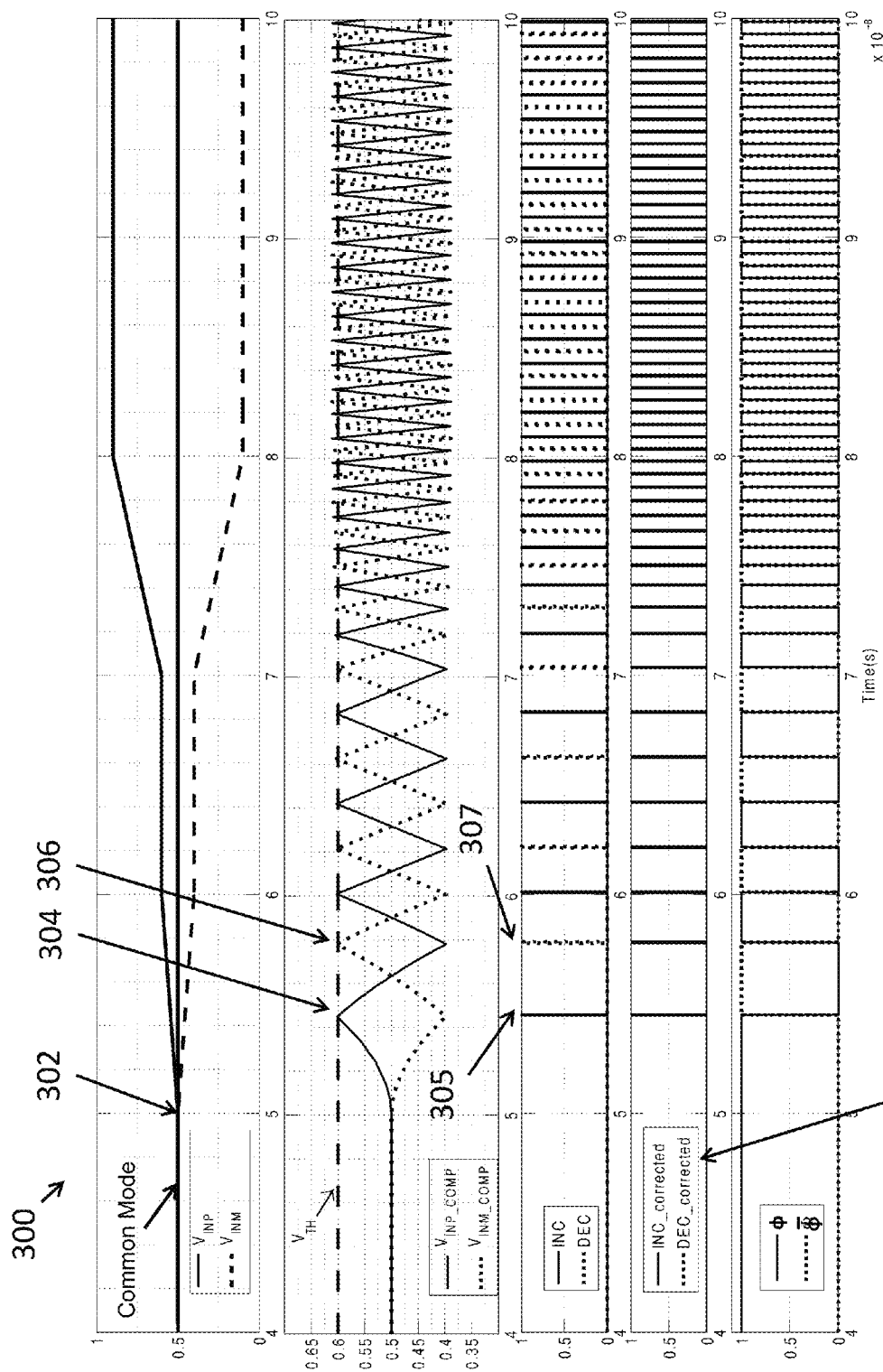
FIG. 3 shows exemplary waveforms that explain the operation of the modulator, according to aspects of the present disclosure.

FIG. 3 shows exemplary waveforms 300 that illustrate the operation of the asynchronous flipping ADC of FIG. 2a. In the example of FIG. 3, initially signal $\phi$ is "1" and signal $\bar{\phi}$ is "0." Signals $V_{INP}$ and $V_{INM}$ are both equal to zero. A person skilled in the art would understand that when the inputs are described as being "0," they can be equal to the common-mode voltage. Signals $V_{INP}$ and $V_{INM}$ are the inputs to the two integrators (202, 204) and are zero. Accordingly, the outputs of the integrators, $V_{INT\_COMP}$ and $V_{INM\_COMP}$, also remain "0." Thus, unlike an asynchronous sigma-delta modulator, the proposed architecture produces no output when the input is "0."

After five seconds (time 302), the values of $V_{INP}$ and $V_{INM}$ can start increasing with positive and negative slopes, respectively. The integrators (202, 204) can start integrating these signals and produce outputs $V_{INT\_COMP}$ and $V_{INM\_COMP}$ as shown in FIG. 3. When the value of signal $V_{INT\_COMP}$ becomes greater than the threshold value, $V_{TH}$, ($V_{INP\_COMP} > V_{TH}$), the output, INC, of comparator 214 becomes "1" (304). This can trigger the positive-edge-triggered T flip-flop 254 in logic block 218 that can toggle the control signals ϕ and $\bar{\phi}$ as show with solid and dotted lines, respectively. Following this, the inputs to the integrators are flipped and they can start integrating in the opposite direction. The output, INC, of comparator 214 becomes "0," which results in a narrow pulse at the comparator output. This pulse (305) can indicate the time instant at which the integrated signal crossed the first quantization level.

As the integration continues, the output of integrator 202, $V_{INP\_COMP}$ drops, whereas the output of integrator 204, $V_{INM\_COMP}$, rises. When the value of signal $V_{INM\_COMP}$ becomes greater than the threshold value, $V_{TH}$, ($V_{INM\_COMP} > V_{TH}$), the output, DEC, of comparator 216 becomes "1" (306). As discussed above, the control signals ϕ and $\bar{\phi}$ can toggle again, when this happens. The output, DEC, of comparator 216 becomes "0," which results in a narrow pulse at the comparator output. This pulse (306) can indicate the time instant at which the integrated signal crossed the second quantization level.

Due to the flipping of the direction of the input, the outputs are also flipped. To reconstruct the correct INC and DEC signals, "INC_corrected" and "DEC_corrected," the logic block contains a set of "chopping" switches 258, as illustrated in FIG. 2b, which can be similar to the ones at the inputs of the integrators, shown in FIG. 2a. As discussed above, switches 258 can be controlled by delayed versions of ϕ and $\bar{\phi}$. The delay ensures the right value is passed to the corrected outputs. The delay can be implemented using a cascade of few inverters. The corrected signals, "INC_corrected" and "DEC_corrected" (308), are also shown in FIG. 3. Only signal "INC_corrected" shows narrow pulses in its waveform, whereas DEC_corrected is "0." This is because the input signal has a nonnegative slope throughout. When the slope is negative, the "DEC_corrected" signal would show narrow pulses in its waveform. Effectively, the structure outputs narrow pulses corresponding to the instances where the integrated signal crosses the level-crossing-sampling thresholds.

The asynchronous flipping ADC thus encodes analog information in the timing of these continuous-time binary pulses. It can generate a delta-modulated output of the integral of the input signal. This is achieved with a very simple feedback structure with switches implementing the DAC. In a delta modulator, the output rate of impulses is proportional to the instantaneous value of the slope of the input signal. Thus, reconstruction is achieved by integration. In the proposed asynchronous flipping ADC, on the other hand, the output rate of impulses is proportional to the instantaneous value of the input signal itself. This is illustrated in FIG. 3. As the instantaneous input value increases, the integrators integrate faster and the density of the output pulses increases. Thus, the output activity rate is proportional to the input signal value. Reconstruction of the input signal value can thus be achieved using a low-pass filter.

The proposed architecture uses a flipping technique to completely remove the need for charge addition and/or subtraction circuitry. The final structure can be extremely minimal, and hence, very area- and power-efficient. The generated narrow pulses can be processed digitally and in continuous time.

When the input of the asynchronous flipping ADC has a constant value, it generates no output impulses. As the value of the input increases, the rate of impulses keeps increasing. Thus, the output activity rate is proportional to the input signal value. In an ASDM on the other hand, with a zero input, the output has a highly oscillatory nature and the frequency of oscillation drops as the input amplitude increases and approaches the full-scale value.

The proposed asynchronous flipping ADC contains no feedback DAC, and achieves the desired functionality through additional switches which occupy less area. Besides, it can completely eliminate the power dissipation of the feedback DAC. The forward path contains an integrator; however, it does not necessarily increase the power consumption of the entire system as it can be a part of a preceding circuit. For example, in the intermediate-frequency (IF) stage in a receiver chain, the ADC is preceded by a number of IF gain stages that amplify the signal. Thus, the integrator could replace one of these IF gain stages and provide some amplification. Accordingly, the added integrator can result in no or minimal increase of the power dissipation of the entire system.

The integrator block can implement the variable gain functionality of the IF stages. This can be accomplished by putting a number of Gm stages in parallel and selectively turning ON/OFF a given number of Gm stages to vary the gain as needed. The output nonlinearities of the Gm stages can be quite relaxed because of the reduced signal swing at the output ($[V_{LSB}/2 \; V_{LSB}/2]$). The nonlinearities are then dominated solely by those associated with the input.

Because of the simpler feedback circuitry, the loop delay is significantly reduced. In the presence of the feedback DAC, settling time of the DAC output occupies some of the timing budget of the loop delay. In the proposed asynchronous flipping ADC, the loop delay is primarily dependent on the comparator delay. The other blocks contribute a negligible amount to it. Thus, the proposed architecture can enable a higher frequency of operation. For example, for a given resolution, it can handle a much higher frequency at its input without having any slope overload. Alternatively, for a given maximum input frequency, it can implement a much higher amplitude resolution without being limited by slope overload.

The resolution of the modulator can be controlled by a single reference voltage, $V_{TH}$, which can be set to $V_{LSB}/2$. By changing its value, the resolution can be changed easily, which enables a tunable resolution.

The proposed architecture is clock-less and can save power and area in clock generation and distribution. Similar to other continuous-time ADCs, it has no aliasing in the spectrum and a higher SNDR than Nyquist-sampling ADCs for a given amplitude resolution.

Figure 4:
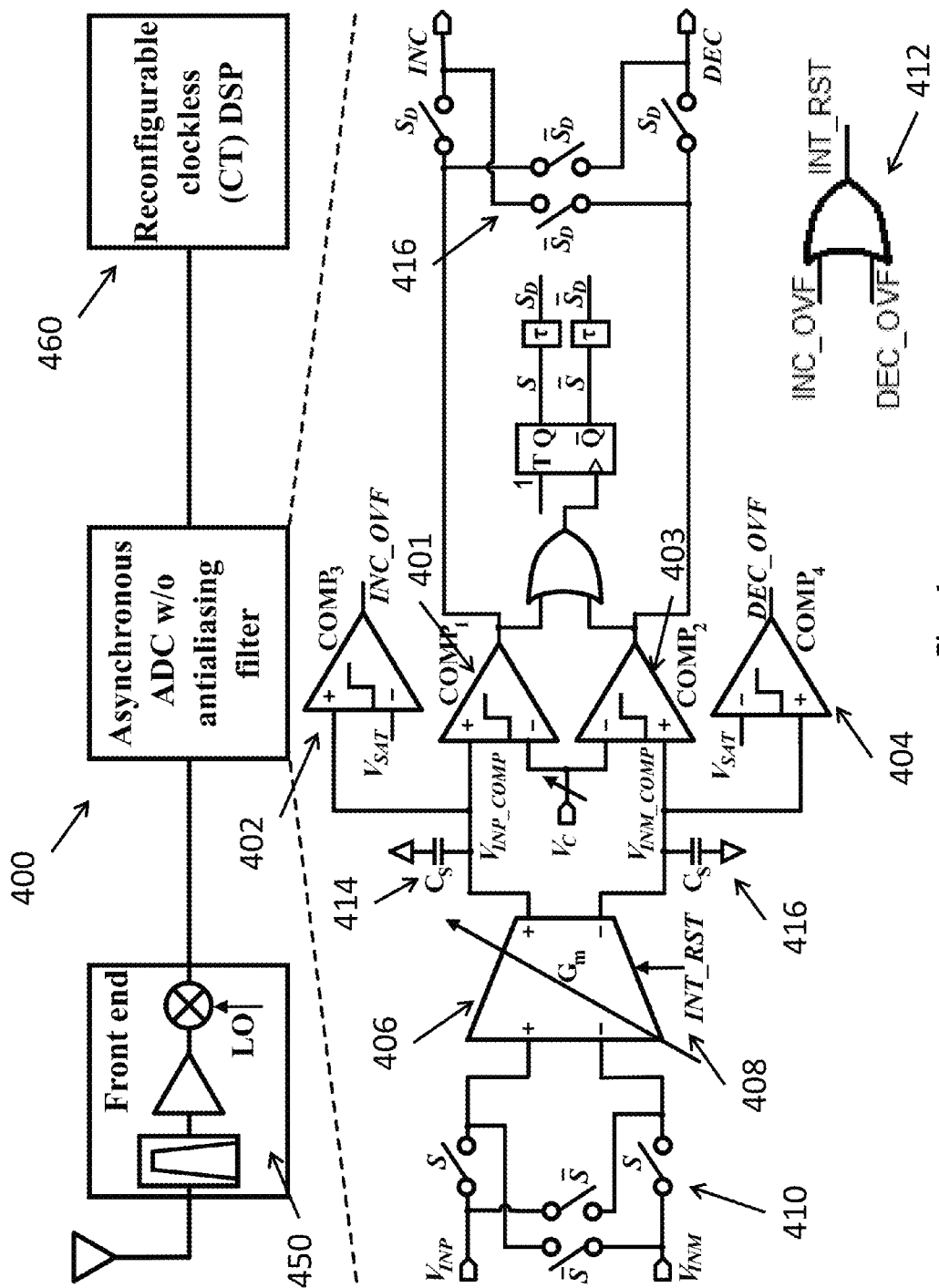
FIG. 4 shows an exemplary architecture of an asynchronous flipping ADC, according to aspects of the present disclosure.

Under certain conditions, overflows can occur and can interfere with the correct operation of the proposed system. The overflow condition can be addressed by forcing the integrator outputs to reset to the common mode voltage, when an overflow is detected. This is illustrated in FIG. 4, which shows an exemplary architecture of a proposed asynchronous flipping ADC 400. As shown in FIG. 4, the asynchronous flipping ADC 400 can be a stage between a front end circuit 450 and a reconfigurable clock-less CT digital signal processor (DSP) 460.

Compared to the architecture illustrated in FIG. 2a, the proposed asynchronous flipping ADC of FIG. 4 includes two additional comparators (402, 404). Integrators 202 and 204 of FIG. 2a are replaced with the Gm-C integrator stage, which can include an input, INT_RST 408, for resetting the integrator outputs. Comparators 402 and 404 can be used to detect when the Gm stage outputs cross a reference value, for example, a value of $V_{SAT}$. The value of $V_{SAT}$ can be set, for example, to be one and a half times the value of the threshold voltage, $V_C$, of comparators 401 and 403, ($V_{SAT} = 1.5 \times V_C$). The value $1.5 \times V_C$ is chosen because it corresponds to the second quantization level for the quantizer, the first threshold being $V_C=V_{LSB}/2$, and the outputs of the overflow comparators can thus also be taken to be a part of the digitized signal. The outputs of comparators 402 and 404 can be "ORed" (412) and the output, INT_RST, can be used to reset the Gm-C integrators to the common-mode voltage.

Conventional delta modulators include an N-bit feedback DAC that generates the 2N levels. The loop delay in the delta modulators is limited by the DAC. However, in a uniform-resolution asynchronous ADC, the amplitude separation between two successive samples is always 1 LSB. The proposed clock-less asynchronous flipping ADC illustrated in FIG. 4, exploits this feature by replacing the N-bit DAC with chopping switches (410) that implement a 1-bit digital-to-analog conversion. Through these chopping switches (410), which are controlled by signal "S" and its complement, the fully differential input $V_{INP}$ (when S=1) or its negative version $V_{INM}$ (when S=0) can be fed to Gm-C integrator (406).

Figure 5:
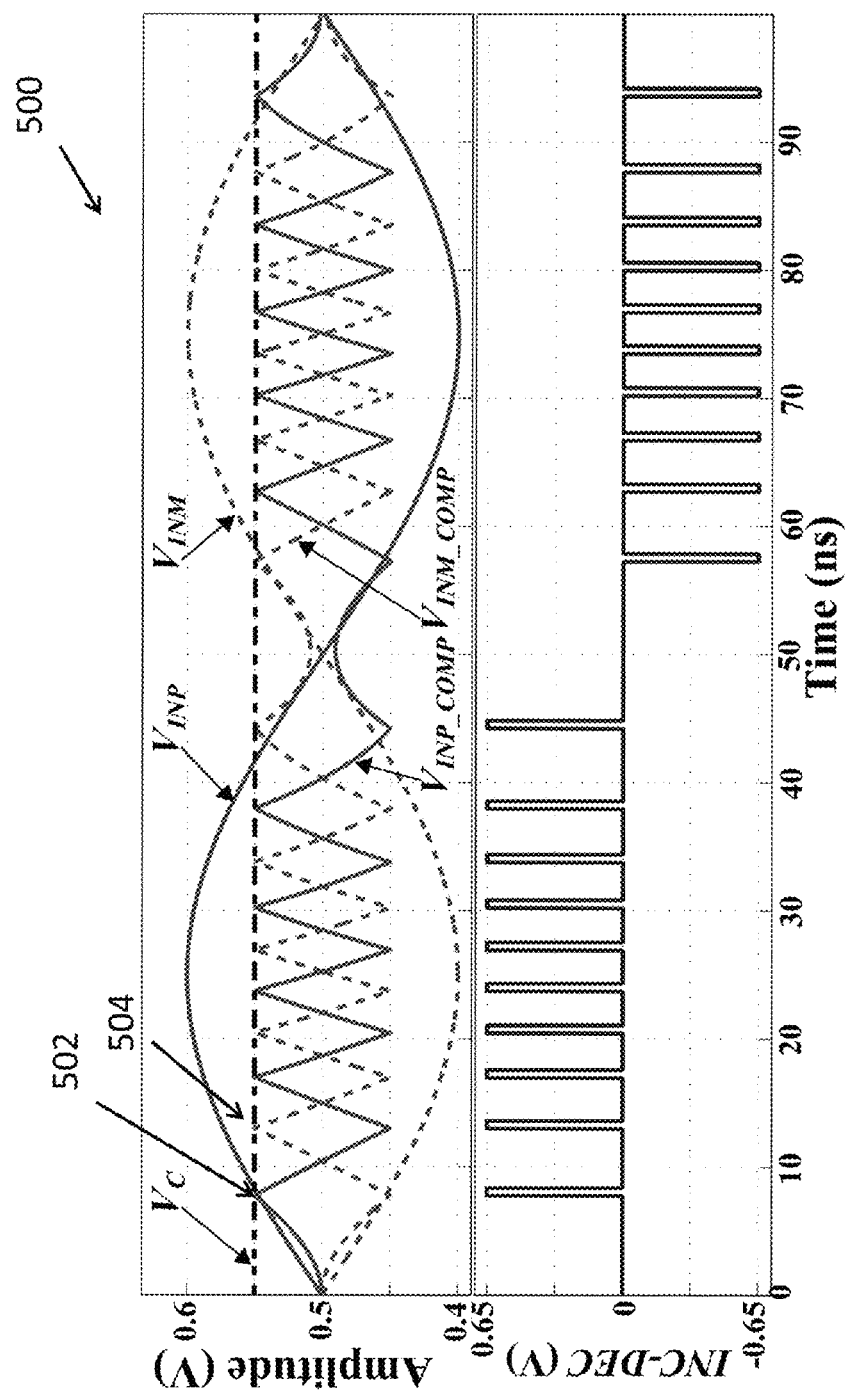
FIG. 5 shows exemplary waveforms that explain the operation of the asynchronous flipping ADC, according to aspects of the present disclosure.

FIG. 5 illustrates an exemplary waveform corresponding to the proposed asynchronous flipping ADC. Once the threshold, $V_C$, is crossed by one of the integrator outputs (502), a corresponding comparator (401, 403) can generate a narrow pulse, as illustrated in FIG. 5. This flips the control signal "S" causing it to charge the capacitances (414, 416), Cs, in the opposite direction. Once the threshold is crossed again (504), another narrow pulse can be generated causing another flip in control signal "S" and the cycle can repeat. The outputs of comparators 401 and 403 can be fed into switches 418 similar to switches 410, controlled by delayed versions of signal "S" for timing constraints, to generate INC and DEC signals. The 2-bit ADC output, $V_{OUT}$, represents the difference between INC and DEC signals. Comparators 402 and 404 can provide overflow protection. They can detect when an integrator output exceeds the comparison window set by $V_C$. This overflow can be corrected by shorting capacitors 414 and 416 (Cs) through switches without loss of information.

The proposed asynchronous flipping ADC can produce an asynchronous delta-modulated version of the integral of the input signal. Therefore, the output pulse rate, and hence power dissipation, can be proportional to the slope of the integral of the input, and thus to the input signal value. This can make the asynchronous flipping ADC operate like a voltage-to-frequency converter (VFC). However, unlike VFCs, the proposed asynchronous flipping ADC is event-driven and produces no pulses when the input is zero or absent. Besides, flipping causes no charge loss and is thus more power efficient than a VFC's integrate-and-reset.

Due to the cascaded integrator and delta modulator operations, the signal goes through an integrator-differentiator cascade, and can come out un-attenuated. However, the quantization error goes through a differentiator transfer function, which can attenuate low-frequency error components, resulting in low in-band error power. This is similar to the case in VCO-based ADCs, which are based on a different principle. The original signal can be obtained by low-pass filtering the output. Error shaping with no aliasing thus enhances the SNDR.

Figure 6A:
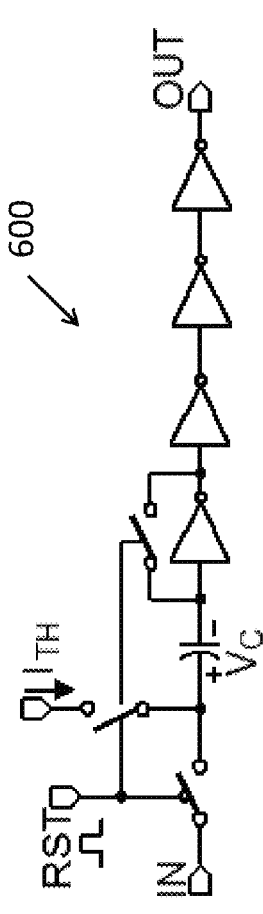
FIG. 6a shows a circuit diagram of an exemplary comparator, according to aspects of the present disclosure.
Figure 6B:
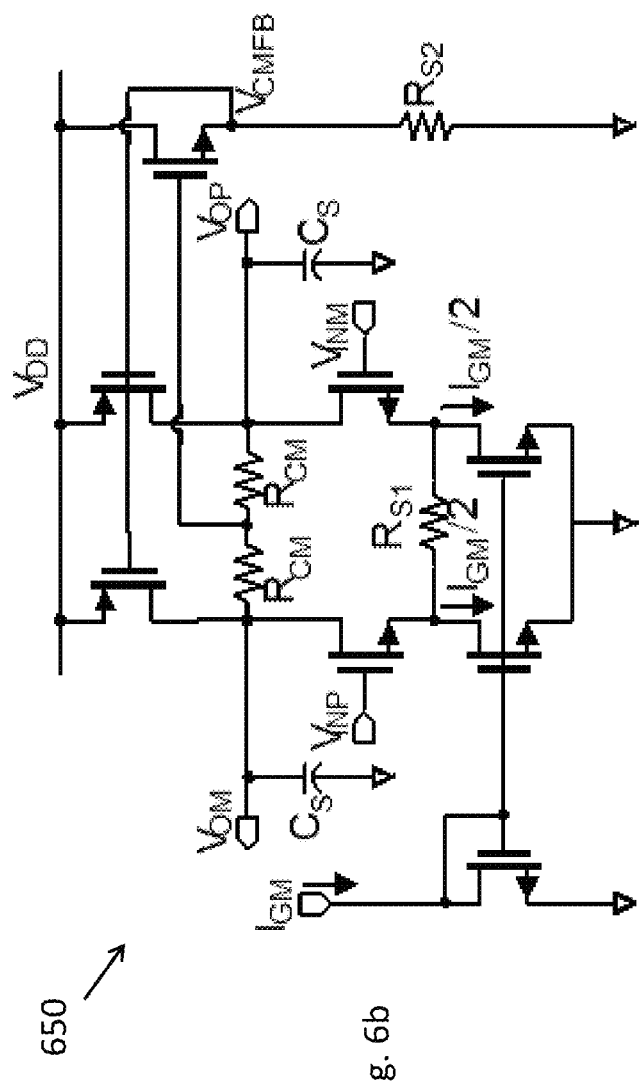
FIG. 6b shows a circuit diagram of an exemplary Gm-C integrator, according to aspects of the present disclosure.

The asynchronous comparators 402 and 404 can use an offset-compensated inverter-based circuit, as illustrated in FIG. 6a. During reset, which can be performed every few miliseconds, the comparator thresholds are set by injecting a charge packet, for example, current $I_{TH}$ for a fixed duration, onto the coupling capacitors. The Gm stage, illustrated in FIG. 6b, can be programmed through the tail current, $I_{GM}$. Its output swing is limited to $V_C$, which can limit the effect of the transistor output nonlinearities. It can also act as an IF gain stage in a receiver, in which case the only blocks that need additional power are the comparators and the logic.

Figure 7:
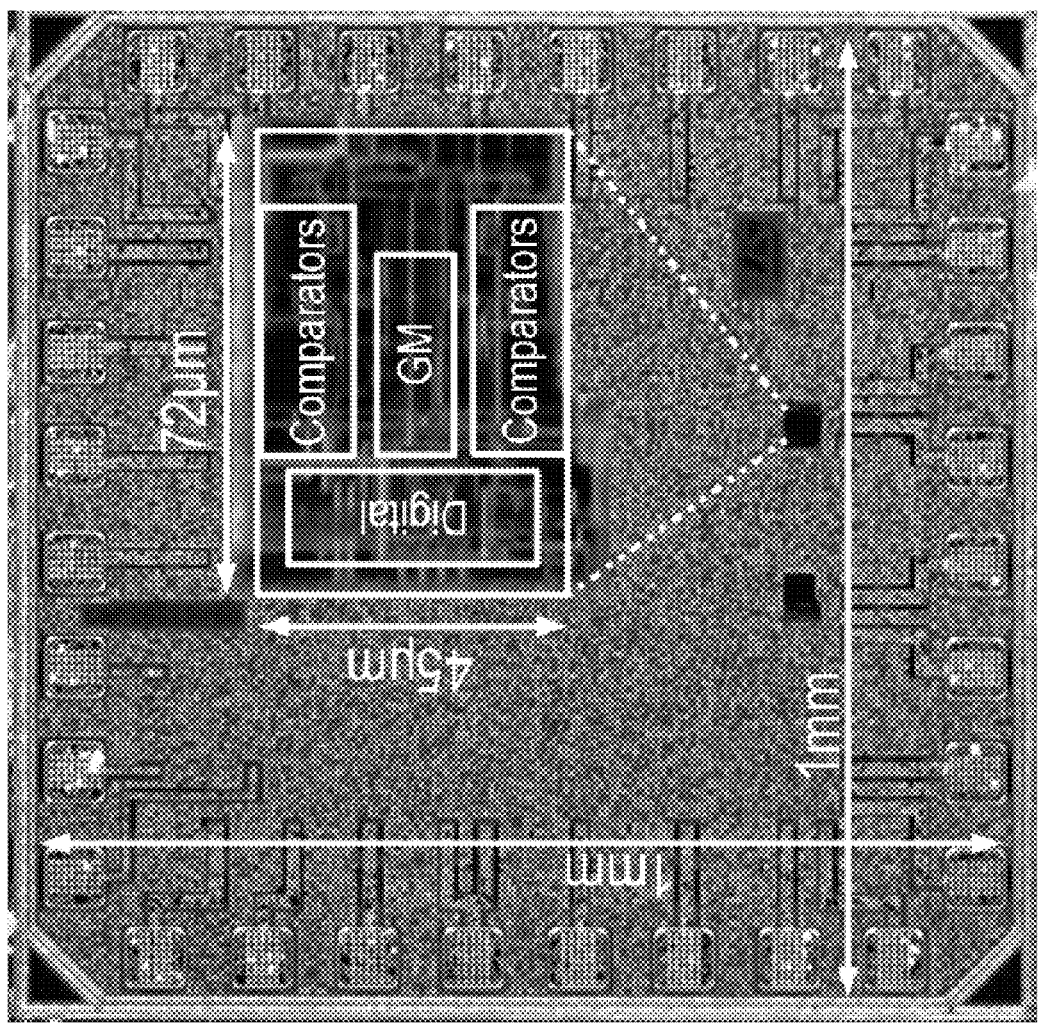
FIG. 7 shows a die micrograph with inset showing zoomed-in version of an exemplary asynchronous flipping ADC, according to aspects of the present disclosure.

FIG. 7 shows a die micrograph with inset showing a zoomed-in version of the asynchronous flipping ADC. The ADC core occupies only 45×72 μm² (0.0032 mm²) No calibration is required and no complex post-processing is used for reconstruction. For single-tone inputs, the output spectrum can consist of the signal and its first-order-shaped odd harmonics.

Figure 8:
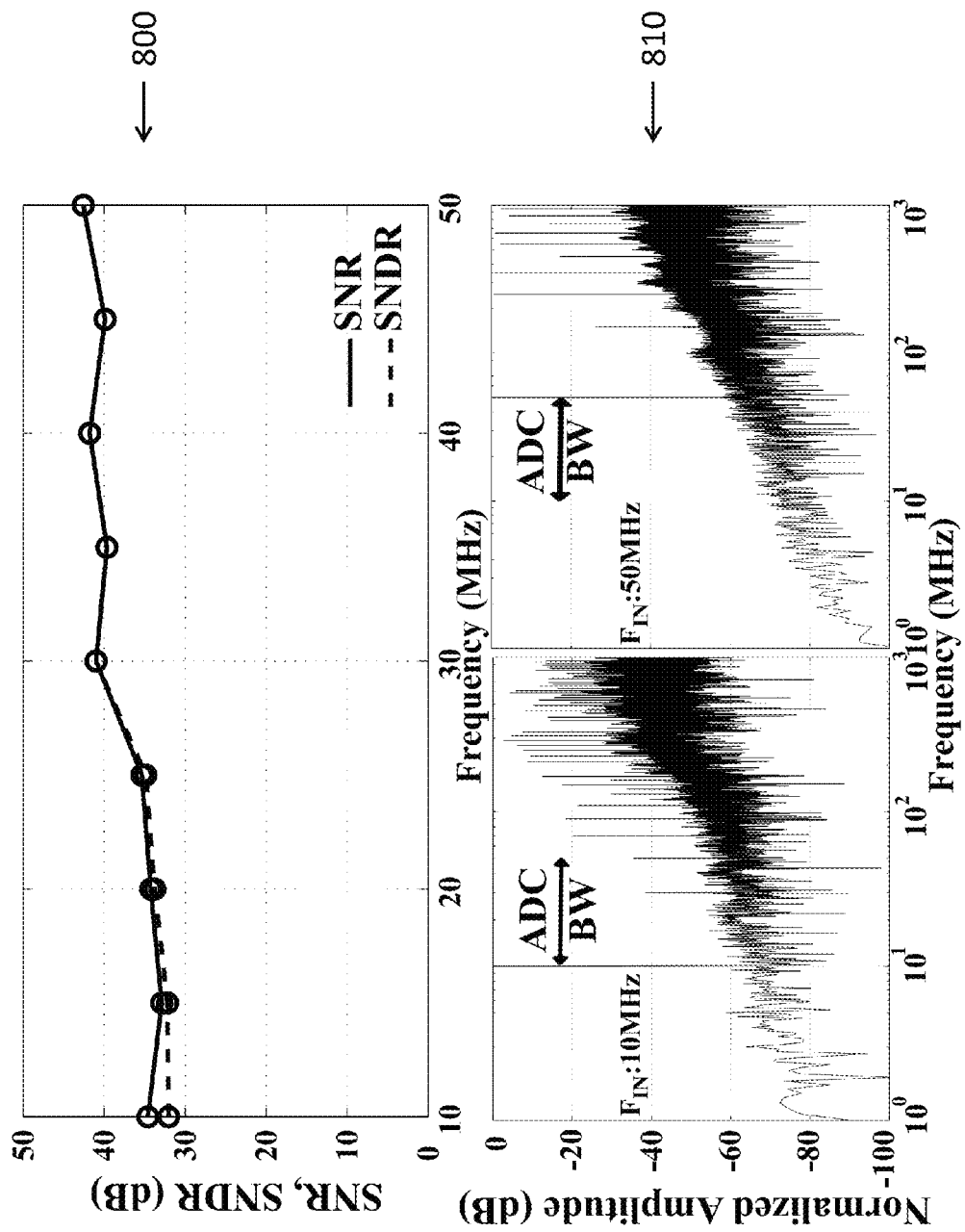
FIG. 8 shows exemplary SNR/SNDR and amplitude plots, according to aspects of the present disclosure.

For the exemplary implementation of the asynchronous flipping ADC of FIG. 7, FIG. 8 shows the measured SNR- and SNDR-vs.-frequency plots (800) and the output spectrum, both for a 150 mVp-p (−3 dBFS) amplitude, $V_C$=80 mV and $I_{GM}$=4 μA (810). First-order quantization error shaping can result in high-power out-of-band quantization spectral components and can attenuate such components at low, in-band, frequencies. The noise and distortion power was integrated over the 10 MHz-50 MHz BW, resulting in 32 dB-42 dB SNDR, which is sufficient for ultra-low-power applications like wake-up receivers. The total power dissipation, including the power of the threshold-setting scheme, is 24 μW, resulting in a Figure of Merit (FoM) of 3-10 fJ/conv-step over the BW. The constant input amplitude can result in constant power dissipation across the BW. The measured maximum output data rate was a 200 MS/s.

Figure 9:
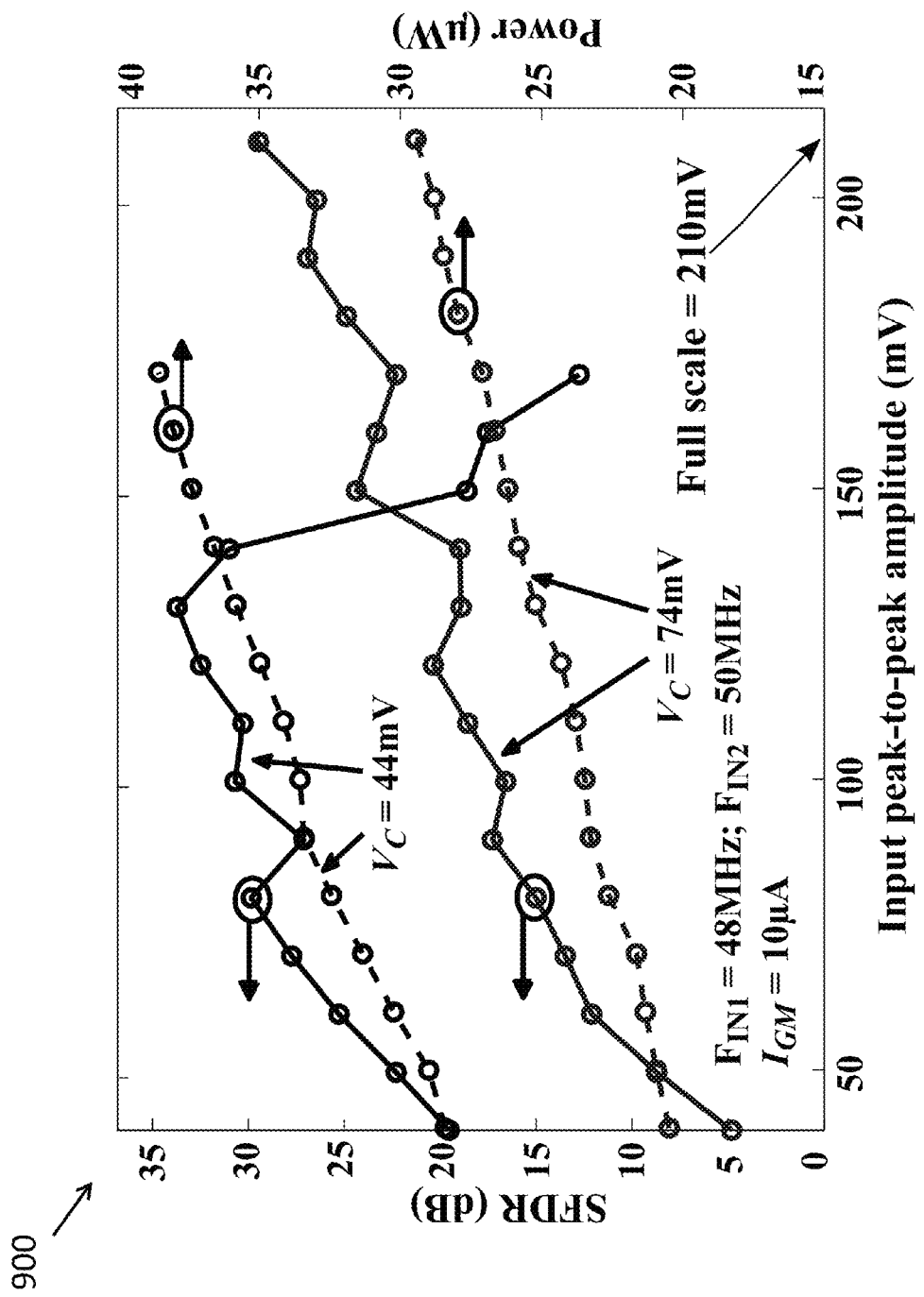
FIG. 9 shows exemplary spurious-free dynamic range (SFDR) plots, according to aspects of the present disclosure.

FIG. 9 shows a plot of the Spurious-Free Dynamic Range (SFDR) and power dissipation over input peak-to-peak amplitude for different $V_C$ values with $I_{GM}$=10 μA. For a 2-tone input, the threshold, $V_C$, (or $I_{GM}$) can be programmed, at the expense of power, to maintain an SFDR>30 dB over a wide amplitude range, as illustrated in FIG. 9, potentially easing the IF AGC in a receiver. Power dissipation can decrease with decreasing signal amplitude, which can confirm the event-driven operation of the asynchronous flipping ADC.

Figure 11:
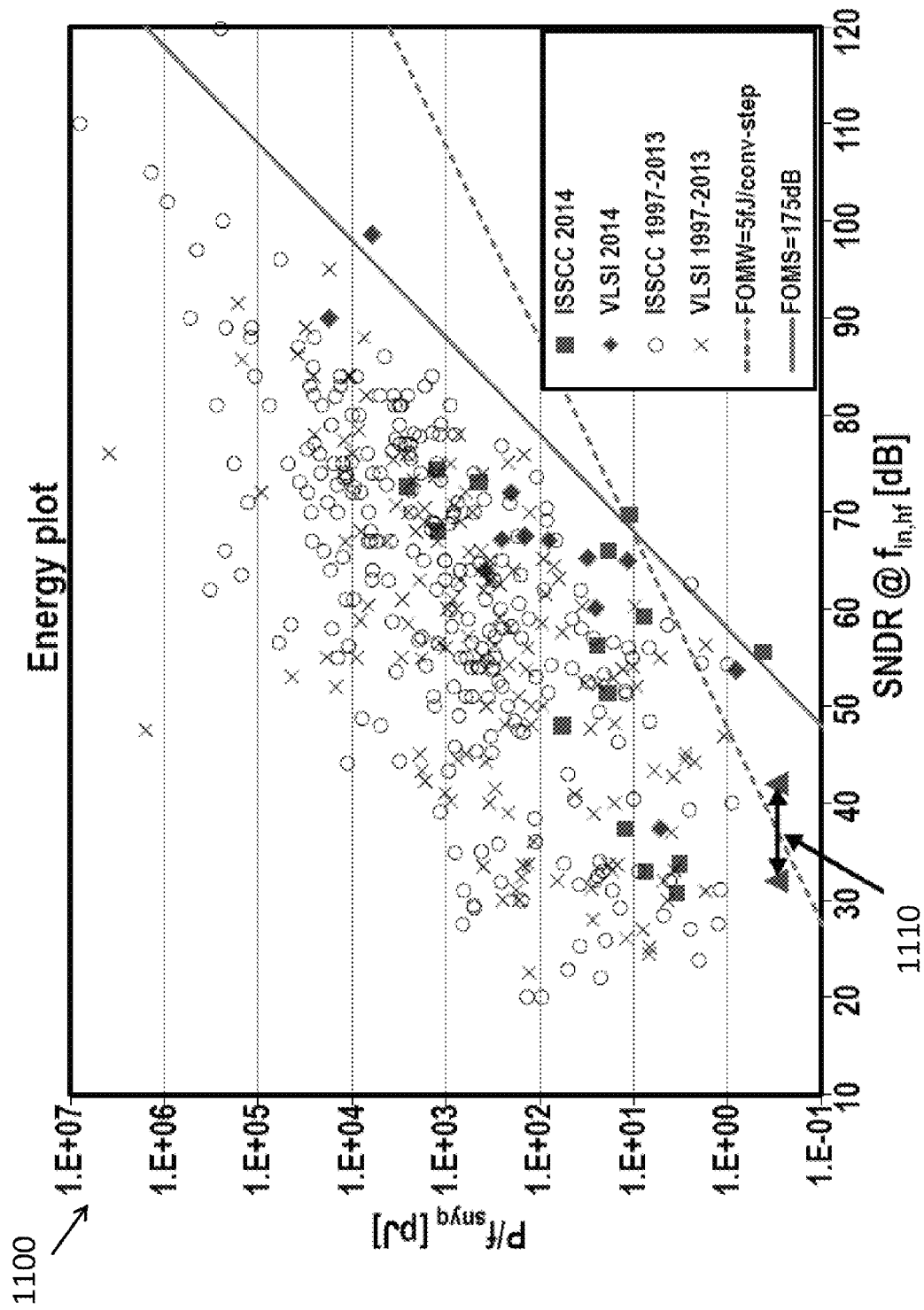
FIG. 11 shows a plot of reported energy values for different ADCs.
Figure 12:
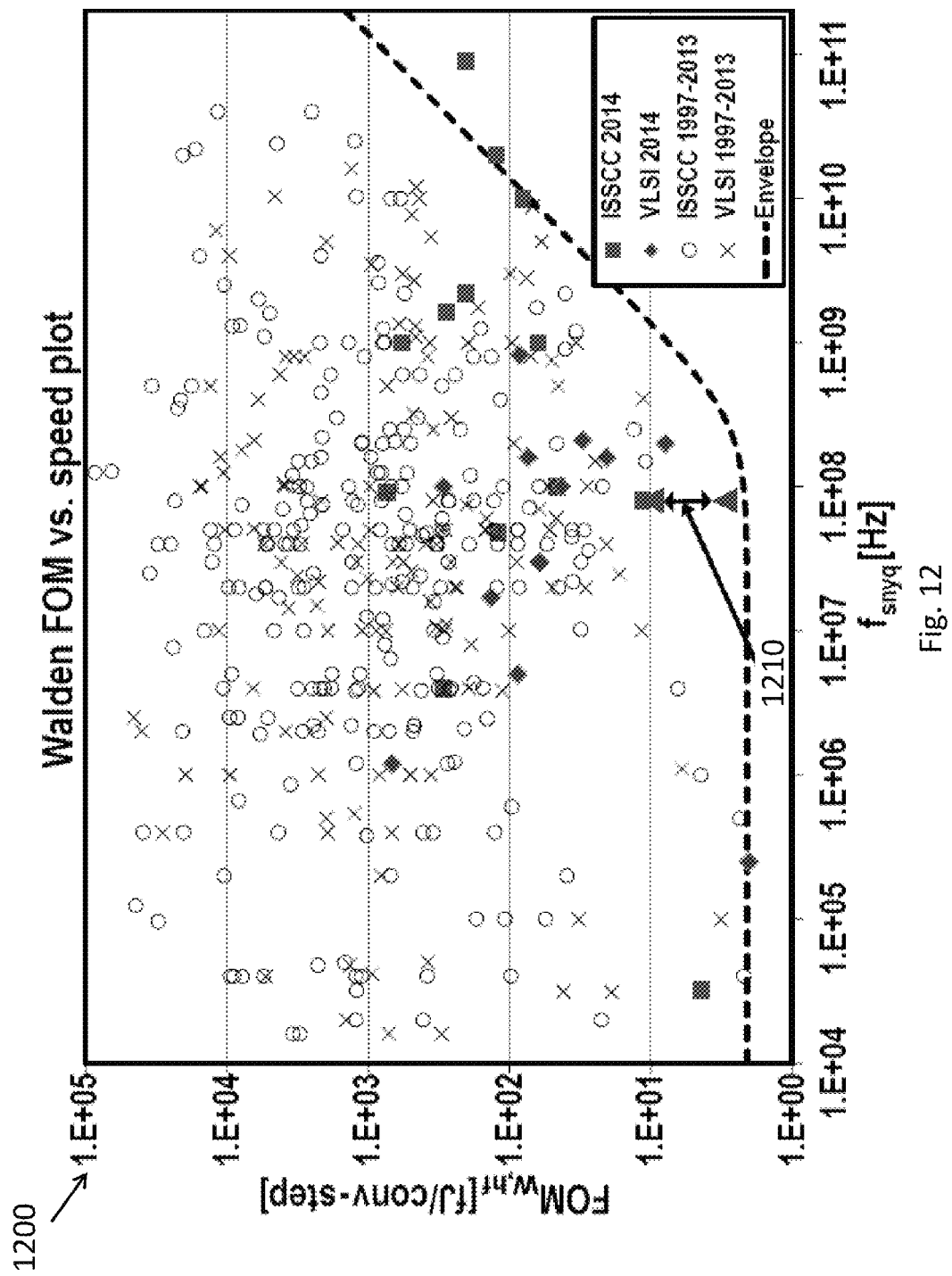
FIG. 12 shows a plot of reported Walden Figure of Merit (FoM) values for different ADCs.

As shown in the Table of FIG. 10 and the graphs in FIGS. 11-12 (1100, 1200), the asynchronous flipping ADC FoM and area are among the best reported (1110, 1210). Specifically, Table 1000 compares different metrics of various prior art ADCs with the proposed asynchronous flipping ADC. The metrics include: technology node, power supply, input bandwidth, sampling rate, core area, SNDR, total power, and FoM.

Figure 13:
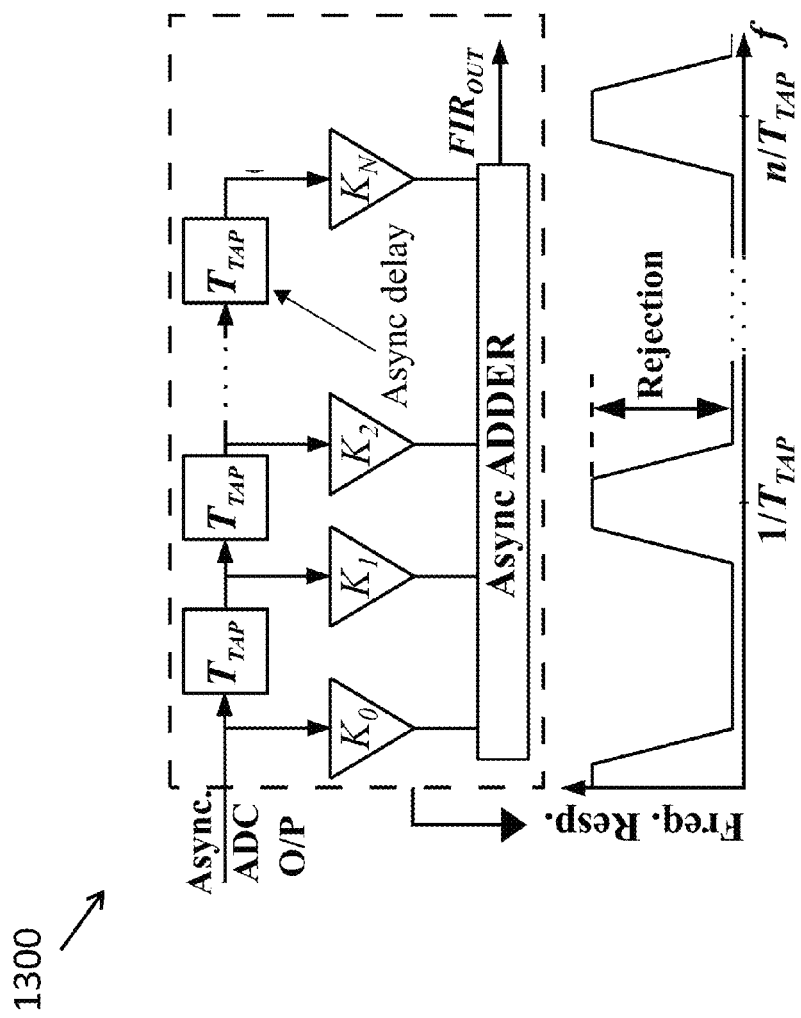
FIG. 13 shows an exemplary asynchronous continuous-time DSP, according to aspects of the present disclosure.

The ADC is thus no longer the bottleneck and can be used in CT DSPs, with no sampling in time, to implement the receiver backend. As an example, FIG. 13 shows a clock-less CT bandpass FIR filter 1300. The FIR filter can have asynchronous delay and adder blocks. Its estimated power dissipation is: $E_{DSP}\times(\# \text{ of taps})\times[V_{IN,pp}\times f_0/V_C]$, where $E_{DSP}$ is the DSP energy per sample per tap and $f_0$ is the $G_m$-C UGB (75 MHz). For an 8-tap FIR, which gives 30 dB rejection, the estimated worst-case power dissipation can be 20 μW. Thus, the ADC power efficiency can be carried over to the DSP as well, because of its low output data rate.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

What is claimed is:

1. An apparatus comprising:
an integrator circuit comprising two integrator inputs and two integrator outputs;
a first switch circuit configured to selectively couple one of a first apparatus input signal and a second apparatus input signal with one of a first integrator input and a second integrator input;
a first comparator configured to:
receive a first output of the integrator circuit and a first reference signal; and
generate a first comparator output signal;
a second comparator configured to:
receive a second output of the integrator circuit and the first reference signal; and
generate a second comparator output signal; and
a second switch circuit configured to selectively couple one of a first apparatus output and a second apparatus output with one of the first comparator output signal and the second comparator output signal.

2. The apparatus of claim 1, further comprising:
a third comparator configured to:
receive the first output of the integrator circuit and a second reference signal; and
generate a third comparator output signal; and
a fourth comparator configured to:
receive the second output of the integrator circuit and the second reference signal; and
generate a fourth comparator output signal.

3. The apparatus of claim 2, further comprising a first logic gate configured to:
receive the third comparator output signal and the fourth comparator output signal; and
generate an output signal based on at least one of the third comparator output signal and the fourth comparator output signal;
wherein the output signal of the first logic gate is coupled to the integrator circuit; and
wherein the integrator circuit is configured to reset the first output of the integrator circuit and the second output of the integrator circuit in response to the output signal of the first logic gate.

4. The apparatus of claim 2, wherein the first switch circuit comprises:
a first switch configured to couple the first integrator input with the first apparatus input signal;
a second switch configured to couple the second integrator input with the first apparatus input signal;
a third switch configured to couple the first integrator input with the second apparatus input signal; and
a fourth switch configured to couple the second integrator input with the second apparatus input signal.

5. The apparatus of claim 2, wherein the second switch circuit comprises:
a fifth switch configured to couple the first apparatus output with the first comparator output signal;
a sixth switch configured to couple the second apparatus output with the first comparator output signal;
a seventh switch configured to couple the first apparatus output with the second comparator output signal; and
an eight switch configured to couple the second apparatus output with the second comparator output signal.

6. The apparatus of claim 2, further comprising:
a switch control generation circuit comprising:
a second logic gate configured to:
receive the first comparator output signal and the second comparator output signal; and
generate an output signal based on at least one of the first comparator output signal and the second comparator output signal;
a flip-flop configured to:
receive the output signal of the second logic gate; and
generate a first control signal and a second control signal; and
a first and second delay circuits configured to:
receive the first control signal and the second control signal; and
generate a third control signal and a fourth control signal, the third control signal being a delayed version of the first control signal and the fourth control signal being a delayed version of the second control signal.

7. The apparatus of claim 6, wherein the first control signal and the second control signal control the first switch circuit; and
wherein the third control signal and the fourth control signal control the second switch circuit.

8. The apparatus of claim 2, wherein at least one of the first comparator, the second comparator, the third comparator, and the fourth comparator comprise an offset-compensated inverter-based circuit.

9. The apparatus of claim 2, wherein a voltage magnitude of the second reference signal is one and a half times a voltage magnitude of the first reference signal.

10. An apparatus comprising:
an asynchronous analog-to-digital converter (ADC) comprising:
an integrator circuit comprising two integrator inputs and two integrator outputs;
a first switch circuit configured to selectively couple one of a first ADC input signal and a second ADC input signal with one of a first integrator input and a second integrator input;
a first comparator configured to:
receive a first output of the integrator circuit and a first reference signal; and
generate a first comparator output signal;
a second comparator configured to:
receive a second output of the integrator circuit and the first reference signal; and
generate a second comparator output signal; and
a second switch circuit configured to selectively couple one of a first ADC output and a second ADC output with one of the first comparator output signal and the second comparator output signal; and
a continuous time filter configured to:
receive the first ADC output and the second ADC output; and
filter the first ADC output and the second ADC output.

11. A method comprising:
providing an integrator circuit comprising two integrator inputs and two integrator outputs;
selectively coupling, by a first switch circuit, one of a first apparatus input signal and a second apparatus input signal with one of a first integrator input and a second integrator input;
receiving, by a first comparator, a first output of the integrator circuit and a first reference signal;

generating, by the first comparator, a first comparator output signal;
receiving, by a second comparator, a second output of the integrator circuit and the first reference signal;
generating, by the second comparator, a second comparator output signal; and
selectively coupling, by a second switch circuit, one of a first apparatus output and a second apparatus output with one of the first comparator output signal and the second comparator output signal.

12. The method of claim 11, further comprising:
receiving, by a third comparator, the first output of the integrator circuit and a second reference signal;
generating, by the third comparator, a third comparator output signal;
receiving, by a fourth comparator, the second output of the integrator circuit and the second reference signal; and
generating, by the fourth comparator, a fourth comparator output signal.

13. The method of claim 12, further comprising:
receiving, by a first logic gate, the third comparator output signal and the fourth comparator output signal; and
generating, by the first logic gate, an output signal being the result of an OR operation of the third comparator output signal and the fourth comparator output signal;
wherein the output signal of the first logic gate is coupled to the integrator circuit; and
wherein the integrator circuit is configured to reset the first output of the integrator circuit and the second output of the integrator circuit in response to the output signal of the first logic gate.

14. The method of claim 12, wherein the first switch circuit comprises:
a first switch configured to couple the first integrator input with the first apparatus input signal;
a second switch configured to couple the second integrator input with the first apparatus input signal;
a third switch configured to couple the first integrator input with the second apparatus input signal; and
a fourth switch configured to couple the second integrator input with the second apparatus input signal.

15. The method of claim 12, wherein the second switch circuit comprises:
a fifth switch configured to couple the first apparatus output with the first comparator output signal;
a sixth switch configured to couple the second apparatus output with the first comparator output signal;
a seventh switch configured to couple the first apparatus output with the second comparator output signal; and
an eight switch configured to couple the second apparatus output with the second comparator output signal.

16. The method of claim 12, further comprising:
receiving, by a second logic gate, the first comparator output signal and the second comparator output signal; and
generating, by a second logic gate, an output signal based on at least one of the first comparator output signal and the second comparator output signal;
receiving, by a flip-flop, the output signal of the second logic gate; and
generating, by the flip-flop, a first control signal and a second control signal; and
generating, a third control signal and a fourth control signal, the third control signal being a delayed version of the first control signal and the fourth control signal being a delayed version of the second control signal.

17. The method of claim 16, wherein the first control signal and the second control signal control the first switch circuit; and
wherein the third control signal and the fourth control signal control the second switch circuit.

18. The method of claim 12, wherein at least one of the first comparator, the second comparator, the third comparator, and the fourth comparator comprise an offset-compensated inverter-based circuit.

19. The method of claim 12, wherein a voltage magnitude of the second reference signal is one and a half times a voltage magnitude of the first reference signal.

20. A method comprising:
providing an integrator circuit comprising two integrator inputs and two integrator outputs;
selectively coupling, by a first switch circuit, one of a first ADC input signal and a ADC second input signal with one of a first integrator input and a second integrator input;
receiving, by a first comparator, a first output of the integrator circuit and a first reference signal;
generating, by the first comparator, a first comparator output signal;
receiving, by a second comparator, a second output of the integrator circuit and the first reference signal;
generating, by the second comparator, a second comparator output signal;
selectively coupling, by a second switch circuit, one of a first ADC output and a second ADC output with one of the first comparator output signal and the second comparator output signal; and
filtering, by a continuous time filter, the first ADC output and the ADC second output.

* * * * *